(12) United States Patent
Fukuda et al.

(10) Patent No.: US 11,355,416 B2
(45) Date of Patent: Jun. 7, 2022

(54) STRUCTURE AND JOINED COMPOSITE

(71) Applicant: KABUSHIKI KAISHA TOSHIBA, Tokyo (JP)

(72) Inventors: Yumi Fukuda, Tokyo (JP); Koichi Harada, Tokyo (JP); Yasushi Hattori, Kawasaki Kanagawa (JP); Maki Yonetsu, Tokyo (JP); Kenji Essaki, Kawasaki Kanagawa (JP); Keiko Albessard, Yokohama Kanagawa (JP); Yasuhiro Goto, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 116 days.

(21) Appl. No.: 17/007,087

(22) Filed: Aug. 31, 2020

(65) Prior Publication Data

US 2021/0296205 A1    Sep. 23, 2021

(30) Foreign Application Priority Data

Mar. 19, 2020   (JP) .............................. JP2020-048712

(51) Int. Cl.
*H01L 23/373*   (2006.01)

(52) U.S. Cl.
CPC ................................ *H01L 23/3735* (2013.01)

(58) Field of Classification Search
CPC .................. H01L 23/3733; H01L 23/3735
See application file for complete search history.

(56) References Cited

U.S. PATENT DOCUMENTS

| 4,699,890 A | * | 10/1987 | Matsui ................. C04B 35/584 |
| | | | 501/97.3 |
| 4,830,991 A | * | 5/1989 | Matsui ................. C04B 35/584 |
| | | | 501/97.3 |
| 2010/0040424 A1 | | 2/2010 | Toyoda et al. |

FOREIGN PATENT DOCUMENTS

| EP | 2 546 216 A1 | 1/2013 |
| EP | 2 902 378 A1 | 8/2015 |
| JP | H11-100274 A | 4/1999 |
| JP | 2005-255462 A | 9/2005 |
| JP | 2012-136378 A | 7/2012 |
| JP | 5894288 B2 | 3/2016 |
| WO | WO 2008/114752 A1 | 9/2008 |
| WO | WO 2011/111746 A1 | 9/2011 |
| WO | WO 2017/014168 A1 | 1/2017 |

* cited by examiner

*Primary Examiner* — Allan R Wilson
(74) *Attorney, Agent, or Firm* — Finnegan, Henderson, Farabow, Garrett & Dunner L.L.P.

(57) ABSTRACT

A structure includes: a β silicon nitride crystal phase; and a $Y_2MgSi_2O_5N$ crystal phase. The structure gives a X-ray diffraction pattern by a θ-2θ method, the pattern having a ratio of a peak intensity of a (22-1) plane of the $Y_2MgSi_2O_5N$ crystal phase to a peak intensity of a (200) plane of the β silicon nitride crystal phase, the peak intensity of the (200) plane being determined at a position of 2θ=27.0±1°, the peak intensity of the (22-1) plane being determined at a position of 2θ=30.3±1°, and the ratio being 0.001 or more and 0.01 or less.

8 Claims, 6 Drawing Sheets

STRUCTURE AND JOINED COMPOSITE

CROSS-REFERENCE TO RELATED APPLICATION

This application is based upon and claims the benefit of priority from Japanese Patent Application No. 2020-048712, filed on Mar. 19, 2020; the entire contents of which are incorporated herein by reference.

FIELD

Embodiments described herein relate to a structure and a joined composite.

BACKGROUND

A known structure contains silicon nitride. Thermal conductivity or bending strength of the structure is desirably high.

DETAILED DESCRIPTION

A structure in an embodiment, includes: a β silicon nitride crystal phase; and a $Y_2MgSi_2O_5N$ crystal phase. The structure gives a X-ray diffraction pattern by a 0-2θ method, the pattern having a ratio of a peak intensity of a (22-1) plane of the $Y_2MgSi_2O_5N$ crystal phase to a peak intensity of a (200) plane of the β silicon nitride crystal phase, the peak intensity of the (200) plane being determined at a position of 2θ=27.0±1°, the peak intensity of the (22-1) plane being determined at a position of 2θ=30.3±1°, and the ratio being 0.001 or more and 0.01 or less.

Hereinafter, embodiments are explained with reference to the drawings. The drawings are schematic, and for example, the relation between thicknesses and plane dimensions, ratios of the thicknesses of respective layers, and the like may sometimes differ from actual ones. In the embodiments, substantially the same components are denoted by the same reference signs, and a description thereof may be sometimes omitted.

Figure 1:
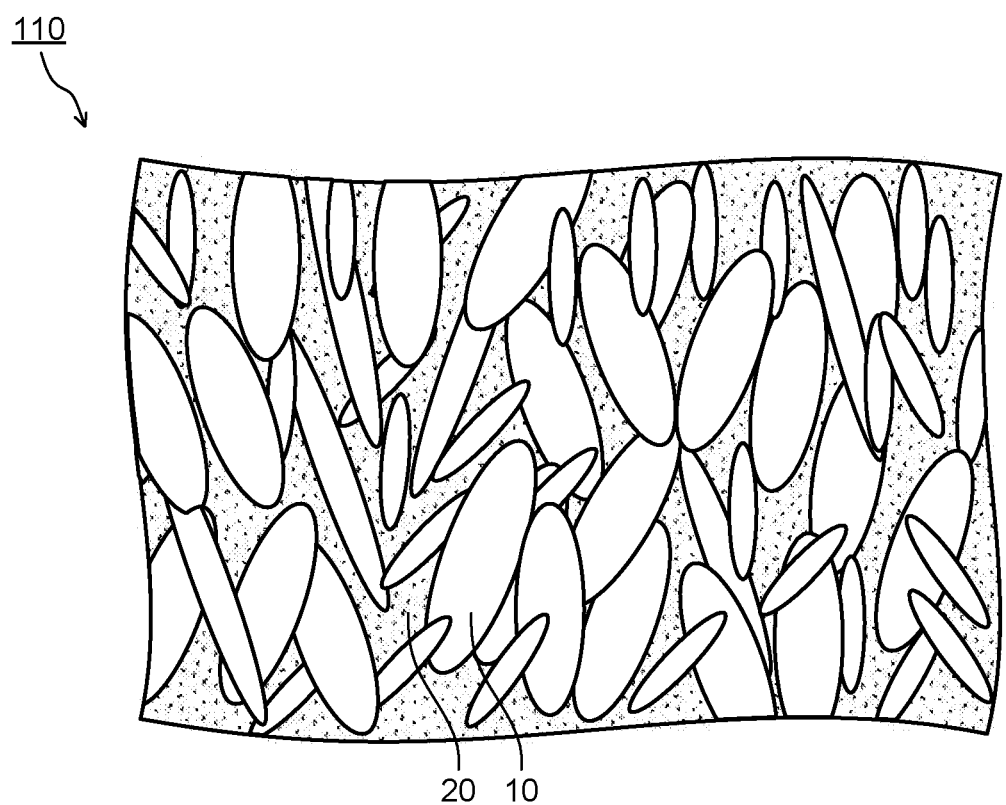
FIG. 1 is a schematic cross-sectional view illustrating a structure according to an embodiment.

FIG. 1 is a schematic cross-sectional view illustrating a structure in an embodiment.

A structure 110 in the embodiment includes a plurality of crystal grains 10, and a grain boundary 20 provided around at least one of the crystal grains 10, as illustrated in FIG. 1.

A plurality of crystal grains 10 is provided in the grain boundary 20. The crystal grains 10 may be provided apart from each other or may be in partial contact with each other. A part of the crystal grains 10 may be spaced from each other and another part of the crystal grains 10 may be in partial contact with each other.

The crystal grain 10 has a (3 silicon nitride crystal phase (a $β-Si_3N_4$ crystal phase). The grain boundary 20 contains yttrium, magnesium, silicon, oxygen, and nitrogen. The grain boundary 20 can has a $Y_2MgSi_2O_5N$ crystal phase. The $Y_2MgSi_2O_5N$ crystal phase indicates a crystal that has the same crystal structure as that of $Y_2MgSi_2O_5N$. The same crystal structure means that crystal systems, space groups, and positional relationships of constituent atoms are the same, and interatomic distances or lattice constants are not necessarily equal. The crystal phase may contain any element. This shows that a composition of the $Y_2MgSi_2O_5N$ crystal phase may be the same as a composition of the $Y_2MgSi_2O_5N$ crystal, or different from the composition of the $Y_2MgSi_2O_5N$ crystal.

The structure in the embodiment may contain the β silicon nitride crystal phase and the $Y_2MgSi_2O_5N$ crystal phase, and may also contain other crystal phases. The structure in the present embodiment is preferably constituted by only two phases, the β silicon nitride crystal phase and the $Y_2MgSi_2O_5N$ crystal phase. The structure formed from only the β silicon and $Y_2MgSi_2O_5N$ crystal phases can improve the thermal conductivity and the strength of the structure. Their reasons are explained below.

The achievement of high strength with high thermal conductivity is to eliminate a weak crystal phase in the structure. Therefore, the grain boundary phase is preferably contains elements distributed as evenly as possible. The even distribution of the elements in the grain boundary phase improves the strength of the grain boundary phase as well as adhesiveness between the β silicon nitride crystal phases, resulting in both high thermal conductivity and high strength. The even distribution of the elements in the grain boundary phase allows the grain boundaries other than the β silicon nitride ($β-Si_3N_4$) crystal phase, that is, the grain boundary phase in the structure of the embodiment to be almost the $Y_2MgSi_2O_5N$ crystal phase. The formation of the grain boundary phase in which the elements are evenly distributed and do not include the grain boundary phase other than the $Y_2MgSi_2O_5N$ crystal phase, which has the weak strength, allows the structure to achieve both high thermal conductivity and high strength.

Figure 2:
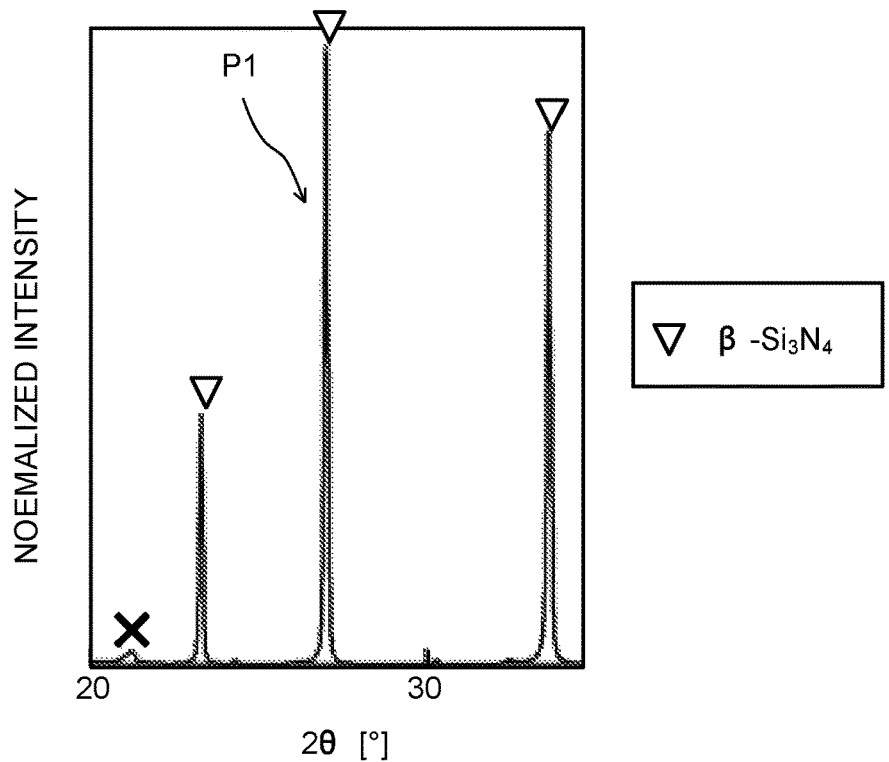
FIG. 2 is a graphic chart illustrating analysis results of the structure according to the embodiment.
Figure 3:
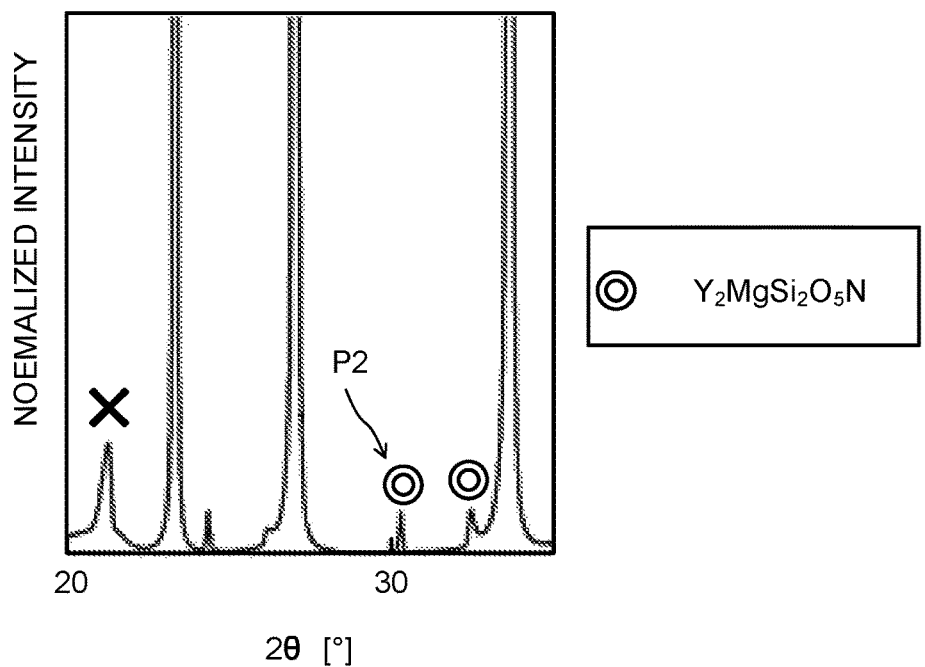
FIG. 3 is a graphic chart illustrating analysis results of the structure according to the embodiment.

FIG. 2 and FIG. 3 are each a graphic chart illustrating analysis results of the structure in the embodiment.

FIG. 2 illustrates a part of an example of X-ray diffraction patterns of the structure in the embodiment by a θ-2θ method. A horizontal axis represents 2θ. A vertical axis represents normalized intensity. FIG. 3 is an enlarged view of a part of FIG. 2.

Conditions for measuring the X-ray diffraction patterns can be set as follows. The X-ray diffraction can use an X-ray diffractometer such as Smart-Lab manufactured by Rigaku Corporation and further use a focusing method (reflection method, Bragg-Brentano method). The X-ray diffraction uses a predetermined cross-section of the structure as a measurement surface. The measurement surface is polished to a surface roughness Ra of 0.05 μm or less. A Cu target (Cu-Kα) is used for the measurement. A tube voltage is set as 45 kV. A tube current is set as 200 mA. A scanning speed is set as 2.0 to 20.0°/min. An incident parallel slit is set as 5 degrees, a longitudinal limiting slit is set as 10 mm, a light-receiving slit is set as 20 mm, and a light-receiving parallel slit is set as 5 degrees. A scanning range (2θ) is set as 10° to 80° and measured in 0.01° increments.

Peaks indicated by white triangles (∇) in the analysis results are attributed to the β silicon nitride crystal phase. Peaks indicated by double circles (◎) are attributed to the $Y_2MgSi_2O_5N$ crystal phase. Peaks indicated by black crosses (x) include peaks, for example, caused by jigs used in the measurement and peaks caused by impurities such as carbon.

As illustrated in FIG. 2 and FIG. 3, in the structure of the embodiment, a peak P1 of a (200) plane of the β silicon nitride crystal phase appears at a position of 2θ=27.0±1.0°. A peak P2 of a (22-1) plane of the $Y_2MgSi_2O_5N$ crystal phase appears at a position of 30.3±1.0°.

A ratio of the highest second peak intensity determined at 30.3±1.0° to the highest first peak intensity determined at 27.0±1.0° is 0.001 or more and 0.01 or less. The ratio of the second peak intensity to the first peak intensity is more preferably 0.005 or more and 0.009 or less. In the structure of the embodiment, the crystal grains of the β silicon nitride crystal phase (a main phase) are provided with the grain boundary phase including mainly the $Y_2MgSi_2O_5N$ crystal phase (a sub phase) therebetween. Too much or too little of an amount of the grain boundary phase included in the structure will reduce the strength of the structure. The achievement of the maximum bending strength is to have a moderate amount of grain boundary phase in the structure. The achievement of both the bending strength and the thermal conductivity can give a suitable ratio of the amount of the grain boundary phase to that of the β silicon nitride crystal phase in the structure. In the structure of the present embodiment, since the grain boundary phase is mainly constituted by the $Y_2MgSi_2O_5N$ crystal phase, the structure having the suitable amount of grain boundary phase contains the amount of the $Y_2MgSi_2O_5N$ crystal phase that is a suitable ratio to the amount of the β silicon nitride crystal phase. Accordingly, the ratio of the highest second peak intensity of the $Y_2MgSi_2O_5N$ crystal phase determined at 30.3±1.0° to the highest first peak intensity of the β silicon nitride crystal phase determined at 27.0±1.0° is 0.001 or more and 0.01 or less, which means that the amount of the $Y_2MgSi_2O_5N$ crystal phase existing between the crystal grains of the β silicon nitride crystal phases is a suitable amount to achieve the excellent thermal conductivity and strength.

When a plurality of peaks appear at 27.0±1.0° or 30.3±1.0°, the ratio is calculated by using the peaks each with the highest intensity. In the same way, when the plurality of peaks appear within a specific angular range, the peak intensity ratio is calculated using the peaks each with the highest intensity.

Next, the present embodiment describes an example of a method of manufacturing the structure.

Weigh 100 mol % of Si in terms of $Si_3N_4$, 2 mol % of $Y_2O_3$, and 5 mol % of MgO. $Y_2O_3$ and MgO are used as auxiliary agents. Further, $B_2O_3$ can be also used as the auxiliary agent, and these may be used alone or in a mixture of several. A ratio of the auxiliary agent is preferably 2 mol % or more and 20 mol % or less in terms of $Si_3N_4$.

These materials are disintegrated and mixed in a planetary ball mill for 0.2 hours or more and 6 hours or less. If the milling time is too short, a material grain size becomes too large and the strength of the structure decreases, which is undesirable. If the milling time is too long, the material grain size becomes too small and the thermal conductivity decreases, which is undesirable. Mixing these auxiliary agents and silicon sufficiently with each other, uneven distribution of the elements can be prevented and even element distribution in the structure can be achieved.

The mixture is then dried and a binder is added to be granulated. In this case, polyvinyl butyl alcohol, an acrylic resin, and the like can be used as the binders. These binders may be used alone or in a mixture of several. An amount of the binder to be added is preferably 1 mass % or more and 20 mass % or less to a total amount. If the amount is smaller than 1 mass %, the materials are difficult to bond with each other and the strength of the structure decreases. If the amount is larger than 20 mass %, the amount of the binder in the structure becomes too high and the thermal conductivity of the structure decreases, which is undesirable.

Then, a pressure of 0.5 t/cm² or more and 10 t/cm² or less is applied to mold the resultant. The pressure is adjusted in accordance with the material. The molded composite is degreased in the air at a temperature of 300° C. or more and 800° C. or less and then treated in a nitrogen atmosphere at a temperature of 1000° C. or more and 1500° C. or less. The treatment times of the degreasing and in the nitrogen atmosphere are adjusted according to the treatment temperatures.

After that, the structure in the embodiment can be obtained by sintering at a temperature of 1700° C. or more and 2100° C. or less for one hour or more and 200 hours or less.

When the above heat-treatment in the nitrogen atmosphere is carried out, silicon nitride is allowed to coexist around a sample in a furnace. Silicon nitride may be allowed to coexist in or around a sample crucible. Volatilization of silicon or silicon nitride in the high-temperature nitrogen atmosphere can be prevented by allowing silicon nitride to coexist around the sample. Though uniformity of the sample decreases because the volatilization of silicon or silicon nitride occurs preferentially from a surface of the sample, the sample can be heat-treated while preventing the volatilization and without reducing the uniformity by allowing silicon nitride to coexist in the vicinity of the sample.

Figure 4:
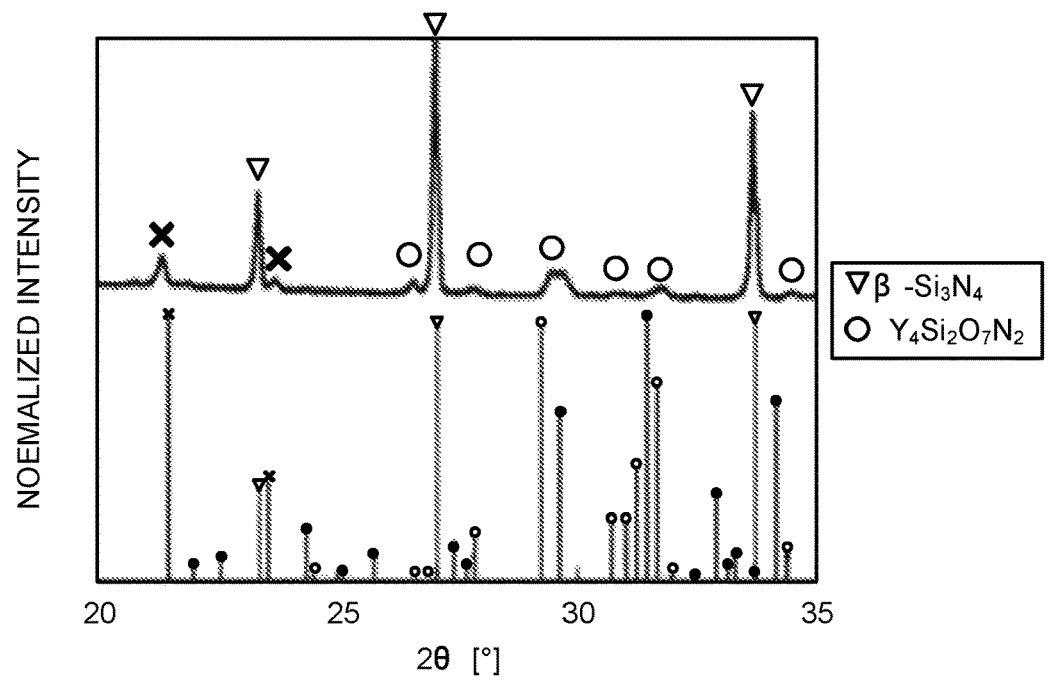
FIG. 4 is a graphic chart illustrating analysis results of a structure according to a first reference example.
Figure 5:
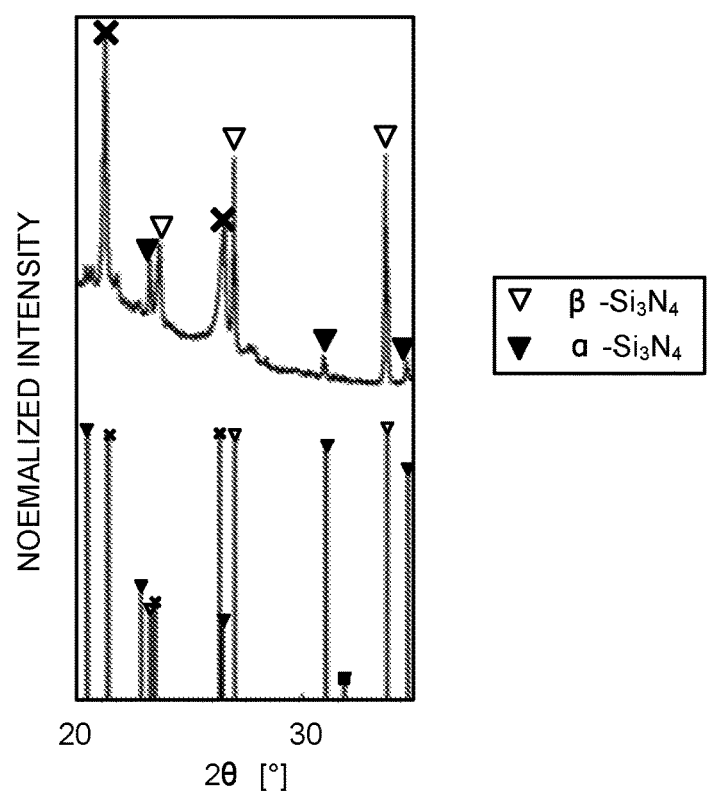
FIG. 5 is a graphic chart illustrating analysis results of a structure according to a second reference example.
Figure 6:
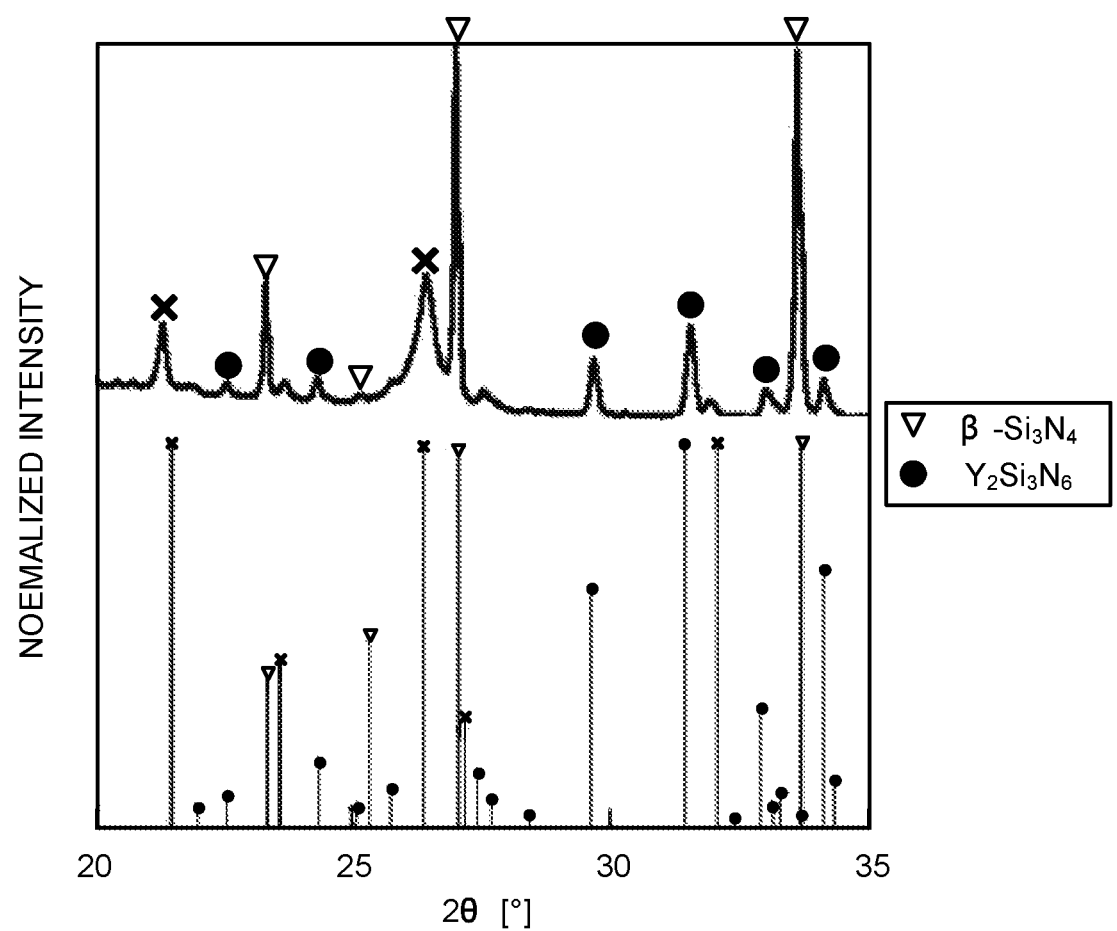
FIG. 6 is a graphic chart illustrating analysis results of a structure according to a third reference example.

FIG. 4, FIG. 5, and FIG. 6 are each a graphic chart illustrating analysis results of a structure according to a reference example.

FIG. 4, FIG. 5, and FIG. 6 each illustrate a part of X-ray diffraction patterns of the structure in the reference example using the θ-2θ method. A horizontal axis represents 2θ. A vertical axis represents normalized intensity. Upper graphs in FIG. 4, FIG. 5, and FIG. 6 illustrate the analysis results of the samples. Lower graphs in FIG. 4, FIG. 5, and FIG. 6 (right side of the paper) illustrate the analysis results of the samples.

FIG. 4 illustrates the analysis results of a structure according to a first reference example. In the upper graph in FIG. 4, peaks indicated by white triangles (∇) are attributed to a β silicon nitride crystal. Peaks indicated by white circles (o) are attributed to a $Y_4Si_2O_7N_2$ crystal. Peaks indicated by black crosses (x) include, for example, peaks caused by jigs used in the measurement and peaks caused by impurities such as carbon.

The lower graph (right side of the paper) in FIG. 4 illustrates diffraction patterns of the β silicon nitride (β-$Si_3N_4$) crystal phase, a $Y_4Si_2O_7N_2$ crystal phase, and the material of the jig. This pattern is illustrated using patterns in a Powder Diffraction File provided by the International Centre for Diffraction Data (registered trademark).

Lines marked with white triangles (∇) indicate angles at which the peaks of β silicon nitride appear. Lines marked with white circles (0) indicate angles at which the peaks of $Y_4Si_2O_7N_2$ appear. Lines marked with black circles (●) indicate angles at which the peaks of $Y_2Si_3N_6$ appear. Lines marked with black crosses (x) indicate angles at which, for example, the peaks caused by the jigs used in the measurement and the peaks caused by impurities such as carbon appear.

In the structure of the embodiment, the $Y_2MgSi_2O_5N$ crystal phase is detected in addition to the β silicon nitride ((β-$Si_3N_4$) crystal phase. In contrast, in the structure of the first reference example, the $Y_2MgSi_2O_5N$ crystal phase is not detected and the $Y_4Si_2O_7N_2$ crystal phase is detected, as illustrated in FIG. 4.

FIG. 5 illustrates the analysis results of a structure according to a second reference example. In the upper graph in FIG. 5, peaks indicated by white triangles (▽) are attributed to the β silicon nitride crystal phase. Peaks indicated by black triangles (▼) are attributed to an α silicon nitride (α-$Si_3N_4$) crystal phase. Peaks indicated by black crosses (x) include, for example, peaks caused by jigs used in the measurement and peaks caused by impurities such as carbon.

The lower graph (right side of the paper) in FIG. 5 illustrates diffraction patterns of the β silicon nitride (β-$Si_3N_4$) crystal phase, the α silicon nitride (α-$Si_3N_4$) crystal phase, and the material of the jig.

Lines marked with white triangles (▽) indicate angles at which the peaks of the β silicon nitride crystal phase appear. Lines marked with black triangles (▼) indicate angles at which the peaks of the α silicon nitride crystal phase appear. Lines marked with black crosses (x) indicate angles at which, for example, the peaks caused by the jigs used in the measurement and the peaks caused by impurities such as carbon appear.

In the structure of the second reference example, the peak attributed to the $Y_2MgSi_2O_5N$ crystal phase does not appear, as illustrated in FIG. 5. The peaks attributed to the α silicon nitride crystal phase appear.

FIG. 6 illustrates the analysis results of a structure according to a third reference example. In the analysis results illustrated in FIG. 6, peaks indicated by white triangles (▽) are attributed to the β silicon nitride crystal phase. Peaks indicated by black circles (●) are attributed to a $Y_2Si_3N_6$ crystal phase. Peaks indicated by black crosses (x) include, for example, peaks caused by jigs used in the measurement and peaks caused by impurities such as carbon.

The lower graph (right side of the paper) in FIG. 6 illustrates diffraction patterns of the β silicon nitride (β-$Si_3N_4$) crystal phase, the $Y_2Si_3N_6$ crystal phase, and the material of the jig. Lines marked with white triangles (▽) indicate angles at which the peaks of the β silicon nitride crystal phase appear. Lines marked with black circles (●) indicate angles at which the peaks of the $Y_2Si_3N_6$ crystal phase appear. Lines marked with black crosses (x) indicate angles at which the peaks caused by the material of the jig appear.

In the structure of the third reference example, the $Y_2MgSi_2O_5N$ crystal phase is not detected, and the $Y_2Si_3N_6$ crystal phase is detected, as illustrated in FIG. 6.

The structure of the first reference example illustrated in FIG. 4 is manufactured using $Si_3N_4$ powder instead of Si powder. That is, $Si_3N_4$, $Y_2O_3$, and MgO are disintegrated and mixed. The mixture is dried and the binder is added to be granulated. The structure in the first reference example is obtained by degreasing and further sintering after molding.

The structure in the second reference example illustrated in FIG. 5 and the structure in the third reference example illustrated in FIG. 6 are manufactured using the Si powder, similar to the structure in the embodiment. After disintegrating and mixing Si, $Y_2O_3$, and MgO, the mixture is molded without adding the binder. The structures in the second and third reference examples are obtained by degreasing and further sintering after molding. Conditions for mixing the raw materials in the planetary ball mill are different between the structure in the second reference example and the structure in the third reference example.

The thermal conductivity and bending strength of the structures according to the embodiment and each reference example are measured. The thermal conductivity is measured in accordance with JIS-R-1611. JIS-R-1611 corresponds to ISO 18755 (2005). The thermal conductivity is measured through a laser flash method with a flash analyzer LFA 467 HyperFlash manufactured by Netch Co., Ltd.

The bending strength is measured by a three-point bending strength test in accordance with JIS-R-1601. JIS-R-1601 corresponds to ISO 14704 (2000). Autograph AG-X (100 kN) manufactured by Shimadzu Corporation is used for the three-point bending strength test. A load cell is set as 1 kN, a test speed is set as 0.5 mm/min, and both an indenter radius and a support radius are set as R2, and a distance between supporting points is set as 30 mm, and the test is performed at room temperature.

The thermal conductivity of the structure in the embodiment is 120 W/(m·K) or more, and preferably 125 W/(m·K) or more. An upper limit of the thermal conductivity is not particularly limited, but for example, it is 250 W/(m·K) or less. The thermal conductivity of the structure in the first reference example is 86 W/(m·K). The thermal conductivity of the structure in the second reference example is 70 W/(m·K). The thermal conductivity of the structure in the third reference example is 127 W/(m·K).

The bending strength of the structure in the embodiment is 600 MPa or more. An upper limit of the bending strength is not particularly limited, but for example, it is 650 MPa or less. The bending strength of the structure in the first reference example is 800 MPa. The bending strength of the structure in the second reference example is 100 MPa. The bending strength of the structure in the third reference example is 200 MPa.

As described above, the thermal conductivity of the structure in the embodiment is higher than the thermal conductivity of the structure in the first or second reference example. The thermal conductivity of the structure in the third reference example is equivalent to the thermal conductivity of the structure in the embodiment. However, the bending strength of the structure in the third reference example is inferior to the bending strength of the structure in the embodiment.

The bending strength of the structure in the embodiment is higher than the bending strength of the structure in the second or third reference example. The bending strength of the structure in the first reference example is higher than the bending strength of the structure in the embodiment. However, the thermal conductivity of the structure in the first reference example is inferior to the thermal conductivity of the structure in the embodiment.

That is, the structure in the embodiment is superior in both the thermal conductivity and the bending strength. According to the embodiment, the structure can achieves the thermal conductivity of 120 W/(m·K) or more, and the bending strength of 600 MPa or more.

As illustrated in FIG. 2, the structure in the embodiment contains the β silicon nitride crystal phase and the $Y_2MgSi_2O_5N$ crystal phase. On the other hand, the structures in the first to third reference examples contain the α silicon nitride crystal phase, the $Y_4Si_2O_7N_2$ crystal phase, or the $Y_2Si_3N_6$ crystal phase. The structures in the first to third reference examples do not contain the $Y_2MgSi_2O_5N$ crystal phase. The improvement in properties due to the embodiment may be therefore resulting from the fact that the structure contains the β silicon nitride crystal phase and the $Y_2MgSi_2O_5N$ crystal phase. For example, as illustrated in FIG. 2, according to the structure in the embodiment, the ratio of the second peak intensity to the first peak intensity is 0.001 or more and 0.01 or less.

In the structure of the embodiment, the grain boundary phase with a high evenness of elements can be formed and the properties of the structure can be improved by containing the $Y_2MgSi_2O_5N$ crystal phase in the grain boundary to a degree where the peak intensity ratio falls within a range of 0.001 or more and 0.01 or less.

As mentioned above, it is important not to form the weak crystal phase in the structure to achieve the high strength while maintaining the high thermal conductivity. The elements are therefore preferably distributed as evenly as possible in the grain boundary phase. The structure in the embodiment is formed by using, for example, silicon, the auxiliary agent containing yttrium and oxygen, and the auxiliary agent containing magnesium and oxygen as raw materials and performing heat-treatment in the nitrogen atmosphere. Therefore, these auxiliary agents and silicon may be sufficiently mixed and nitrided without the uneven distribution of certain elements at the grain boundary other than the β silicon nitride (β-$Si_3N_4$) crystal phase in the structure, resulting in the formation of a crystal phase containing silicon, yttrium, magnesium, oxygen, and nitrogen as a sub phase in some cases. The formation of the grain boundary phase in which the elements are evenly distributed and not including the grain boundary phase other than the $Y_2MgSi_2O_5N$ crystal phase, which has the weak strength, allows the structure to achieve both the high thermal conductivity and the high strength.

For the $Y_2MgSi_2O_5N$ crystal phase, full width at half maximum of the peak P2 illustrated in FIG. 3 is preferably 0.05° or more and 0.2° or less. Crystallinity of the $Y_2MgSi_2O_5N$ crystal phase is high to a degree where the full width at half maximum is 0.05° or more and 0.2° or less, resulting in that the thermal conductivity and bending strength of the structure can further be improved.

Figure 7:
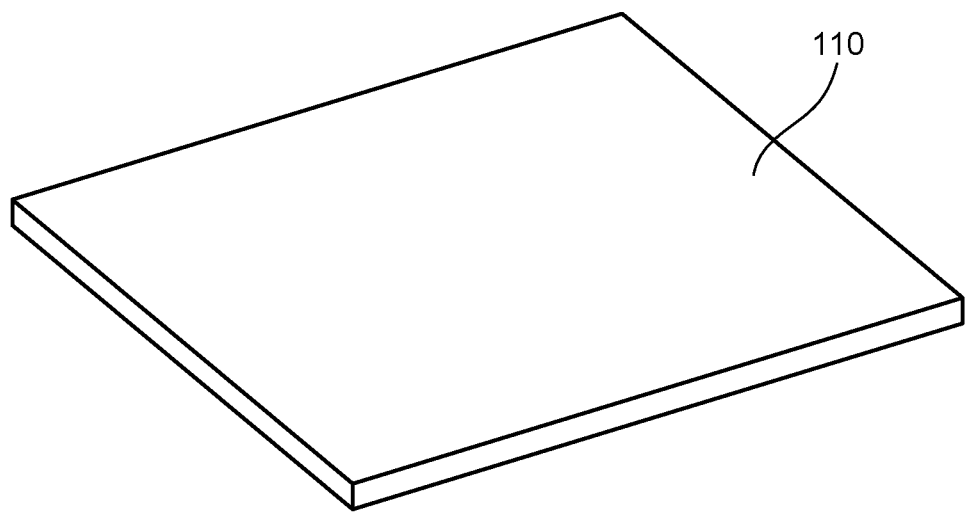
FIG. 7 is a perspective view illustrating the structure according to the embodiment.
Figure 8:
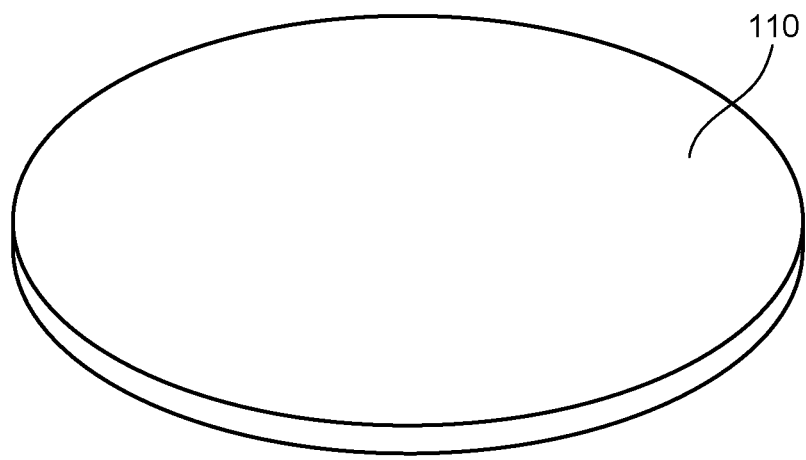
FIG. 8 is a perspective view illustrating the structure according to the embodiment.

FIG. 7 and FIG. 8 are each a perspective view illustrating the structure in the embodiment.

For example, as illustrated in FIG. 7 and FIG. 8, the structure 110 is a substrate. A shape of the substrate is random. As mentioned above, the structure in the embodiment has high thermal conductivity and bending strength. For this reason, the structure in the embodiment can be suitably used for the substrate. Otherwise, the structure in the embodiment may be a component such as a bearing.

Figure 9:
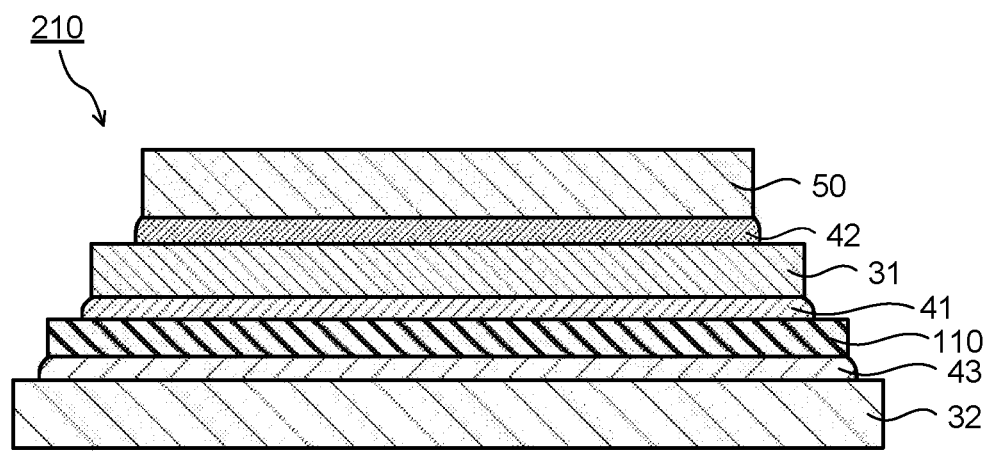
FIG. 9 is a schematic cross-sectional view illustrating a joined composite according to the embodiment.

FIG. 9 is a schematic cross-sectional view illustrating a joined composite in the embodiment.

A joined composite 210 in the embodiment includes a first metal member 31 and the structure 110, as illustrated in FIG. 9. In this example, the structure 110 is used as the substrate.

The first metal member 31 is joined to the structure 110. For example, a joint member 41 is provided between the first metal member 31 and the structure 110. The first metal member 31 may be directly joined to the structure 110 without the joint member 41 therebetween.

In the example illustrated in FIG. 9, the joined composite 210 further includes a second metal member 32 and a semiconductor element 50. The semiconductor element 50 is joined to the first metal member 31. The first metal member 31 is located between the structure 110 and the semiconductor element 50. For example, a joint member 42 is provided between the semiconductor element 50 and the first metal member 31. The semiconductor element 50 may be directly joined to the first metal member 31 without the joint member 42 therebetween.

The second metal member 32 is joined to the structure 110. The structure 110 is located between the first metal member 31 and the second metal member 32. For example, a joint member 43 is provided between the second metal member 32 and the structure 110. The second metal member 32 may be directly joined to the structure 110 without the joint member 43 therebetween. The second metal member 32 functions as, for example, a heat sink.

The first metal member 31 and the second metal member 32 contain at least one selected from the group consisting of, for example, copper and aluminum. The joint members 41 to 43 contain at least one selected from the group consisting of, for example, silver and copper. The joint members 41 to 43 may further contain at least one selected from the group consisting of titanium, hafnium, zirconium, niobium, silicon, magnesium, indium, tin, and carbon. The semiconductor element 50 includes, for example, a diode, a MOSFET, or an IGBT.

The joint members 41 to 43 preferably contain an active metal. For example, when the first metal member 31 and the second metal member 32 contain copper, the active metal is at least one selected from the group consisting of titanium, hafnium, zirconium, and niobium. The joint members 41 to 43 preferably contain at least one selected from the group consisting of silver, copper, titanium, hafnium, zirconium, and niobium.

When the first metal member 31 and the second metal member 32 contain aluminum, the active metal is at least one selected from the group consisting of silicon and magnesium. The joint members 41 to 43 preferably contain at least one selected from the group consisting of silver, copper, silicon, and magnesium.

When the first metal member 31 and the second metal member 32 contain copper, the active metal is particularly preferably titanium. Titanium reacts with silicon nitride to form titanium nitride, which increases joining strength.

An use of the structure 110 in the embodiment for the joined composite 210 can improve the thermal conductivity and bending strength of the joined composite 210. The use of the structure 110 having the excellent thermal conductivity for the substrate can improve a heat dissipation property of the substrate. The structure 110 further has excellent bending strength. This allows the substrate to be thinner while maintaining the strength of the substrate. This can further improve the heat dissipation property of the substrate.

According to each of the above-described embodiments, the structure and the joined composite capable of improving the thermal conductivity and the bending strength can be provided.

Hereinabove, the embodiments of the present invention have been described with reference to concrete examples. However, the embodiments are not limited to these concrete examples. For example, the concrete configurations of respective elements, such as the structure, the metal member, the joint member, and the semiconductor element are included within the scope of the present invention insofar as the present invention can be similarly implemented and the same effects can be achieved by properly selecting the configurations from the range of knowledge available to those skilled in the art.

Any two or more elements in each concrete example combined to the extent technically possible are also included within the scope of the present invention insofar as they include the gist of the present invention.

All other structures and joined bodies that can be implemented by those skilled in the art based on the structures and joined bodies described above as the embodiments of the present invention and designed and modified accordingly also fall within the scope of the invention insofar as they include the gist of the present invention.

Within the scope of the present invention, those skilled in the art will be able to come up with various examples of changes and modifications, and it is understood that those examples of changes and modifications are also within the scope of the present invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A structure comprising:
a $\beta$ silicon nitride crystal phase; and
a $Y_2MgSi_2O_5N$ crystal phase, wherein
the structure gives a X-ray diffraction pattern by a $\theta$-$2\theta$ method, the pattern having a ratio of a peak intensity of a (22-1) plane of the $Y_2MgSi_2O_5N$ crystal phase to a peak intensity of a (200) plane of the $\beta$ silicon nitride crystal phase, the peak intensity of the (200) plane being determined at a position of $2\theta=27.0\pm1°$, the peak intensity of the (22-1) plane being determined at a position of $2\theta=30.3\pm1°$, and the ratio being 0.001 or more and 0.01 or less.

2. The structure according to claim 1, wherein
a full width at half maximum of the peak of the (22-1) plane is 0.05° or more and less than 0.20°.

3. The structure according to claim 1, comprising
crystal grains having the $\beta$ silicon nitride crystal phase, and
a grain boundary provided around at least one of the crystal grains and having the $Y_2MgSi_2O_5N$ crystal phase.

4. The structure according to claim 1, wherein
a thermal conductivity is 120 W/(m·K) or more, and
a bending strength is 600 MPa or more.

5. A joined composite comprising:
a substrate of the structure according to claim 1; and
a first metal member joined to the substrate.

6. The joined composite according to claim 5, wherein
the substrate and the first metal member are joined to each other with a first joint member therebetween,
the first metal member contains copper, and
the first joint member contains at least one selected from the group consisting of silver, copper, titanium, hafnium, zirconium, niobium, silicon, magnesium, indium, tin, and carbon.

7. The joined composite according to claim 5, further comprising:
a second metal member joined to the substrate, wherein
the substrate is provided between the first and second metal members.

8. The joined composite according to claim 5, further comprising:
a semiconductor element joined to the first metal member, wherein
the first metal member is provided between the substrate and the semiconductor element.

* * * * *